United States Patent

Brown et al.

[15] 3,640,782

[45] Feb. 8, 1972

[54] DIFFUSION MASKING IN SEMICONDUCTOR PREPARATION

[72] Inventors: Dale M. Brown; Marvin Garfinkel, both of Schenectady, N.Y.

[73] Assignee: General Electric Company

[22] Filed: Aug. 16, 1968

[21] Appl. No.: 761,389

Related U.S. Application Data

[63] Continuation-in-part of Ser. No. 675,227, Oct. 13, 1967, abandoned.

[52] U.S. Cl. ....................148/187, 29/578, 156/17, 317/234 R

[51] Int. Cl. ....................H01l 7/44

[58] Field of Search ....................148/187; 29/578; 156/17

[56] References Cited

UNITED STATES PATENTS

| | | | |
|---|---|---|---|
| 3,193,418 | 7/1965 | Cooper et al. | 148/187 |
| 3,431,150 | 3/1969 | Dolan, Jr. et al. | 148/1.5 |
| 3,479,237 | 11/1969 | Bergh et al | 148/187 |
| 3,486,951 | 12/1969 | Norby | 148/186 |
| 3,477,886 | 11/1969 | Ehlenberger | 148/187 |

*Primary Examiner*—L. Dewayne Rutledge
*Assistant Examiner*—J. Davis
*Attorney*—Paul A. Frank, John F. Ahern, Frank L. Neuhauser, Oscar B. Waddell and Melvin M. Goldenberg

[57] ABSTRACT

Discloses, in the fabrication of semiconductor devices, the use of a nonreactive metallic layer such as molybdenum, which forms an adherent bond with dielectric insulating films, as a diffusion mask. The metallic layer may also be used as an etching mask to permit selective removal of portions of passivation layers.

9 Claims, 2 Drawing Figures

PATENTED FEB 8 1972

3,640,782

Figure 1:
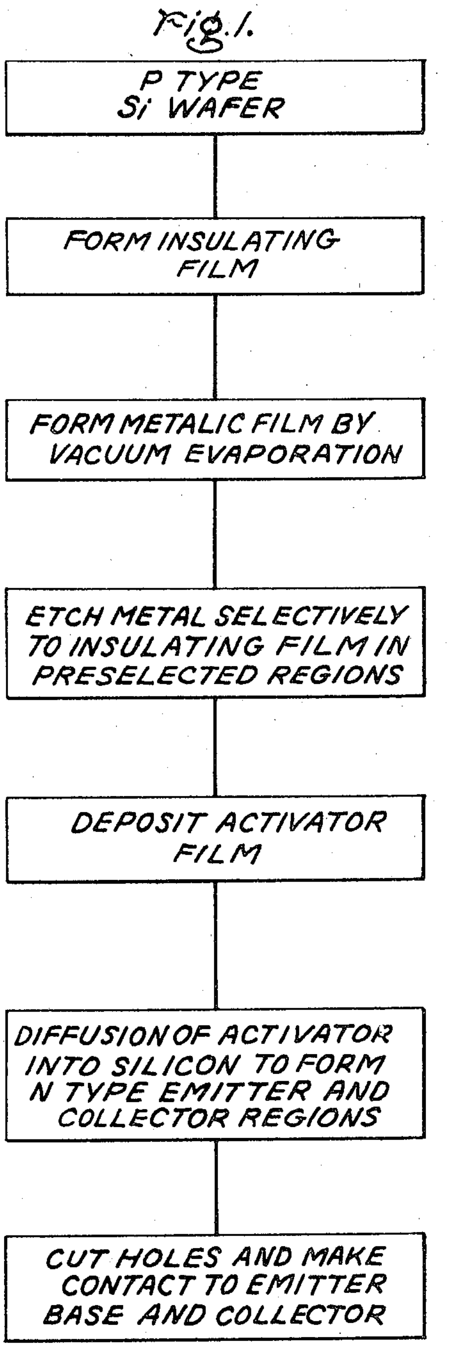

Inventors:
Dale M. Brown,
Marvin Garfinkel,
by John F. Ahern
Their Attorney.

DIFFUSION MASKING IN SEMICONDUCTOR PREPARATION

This application is a continuation-in-part of our copending application, Ser. No. 675,227, filed Oct. 13, 1967 now abandoned, and assigned to the present assignee.

The present invention relates to fabrication of semiconductor devices utilizing diffusion techniques and devices produced thereby. More particularly, the invention is directed to improved diffusion masking techniques for semiconductor devices and circuits.

RELATED APPLICATIONS

This application is related to the following copending applications: Ser. No. 675,225—Engeler; Ser. No. 675,228—Brown, Engeler, Garfinkel, and Gray, now U.S. Pat. No. 3,566,517; Ser. No. 679,957—Brown and Engeler, now U.S. Pat. No. 3,566,518, which were filed Oct. 13, 1967; and Ser. No. 725,683—Engeler, now U.S. Pat. No. 3,566,457; and Ser. No. 725,825—Brown and Engeler, now U.S. Pat. No. 3,573,571, both filed May 1, 1968, all of which are assigned to the present assignee, the disclosures of which are incorporated herein by reference thereto.

In the formation of semiconducting devices utilizing diffusion techniques, it is a general prior art practice to begin the fabrication of a device, as for example, a silicon semiconductor device, by forming a silicon dioxide layer, for example, on the surface thereof and etching a preselected pattern in the oxide layer utilizing photochemical techniques and photoresist compounds. It is then normal to diffuse activator impurities into the silicon at those portions of the wafer at which the oxide layer is removed, utilizing the patterned oxide as a diffusion mask, to cause the creation of surface-adjacent regions having modified conductivity characteristics, most generally, although not exclusively, of opposite conductivity type to the main body of the silicon semiconductive body, and thereby form internal asymmetric junctions, such as PN-junctions.

Difficulties arise in the utilization of such techniques, in that silicon dioxide is not effective to completely mask certain activator impurities, as for example, phosphorus and boron, unless the silicon dioxide is so thick as to be prohibitively complicated in fabrication. Additionally, it is difficult to etch thick layers of silicon dioxide using standard photoresist techniques.

Accordingly, it is an object of the present invention to provide improved diffusion masks for the formation of semiconductor devices.

Yet another object of the present invention is to provide improved methods for the formation of diffused semiconductor devices utilizing diffusion masking techniques.

Yet another object of the present invention is to provide improved semiconductor devices provided by improved diffusion masking techniques in the fabrication thereof.

Another object of the invention is to fabricate semiconductor devices by a method which does not require etching of the passivating layer prior to the formation of junctions thereunder.

Another object of the invention is to provide a method of fabricating semiconductor devices wherein passivation layers are protected by superposed adherent metallic films.

Briefly stated, in accord with the present invention, improved semiconductor devices are provided by forming, over a passivated semiconductor body into which it is desired to diffuse activator impurities, a metallic film comprising metals such as molybdenum and tungsten, for example, which are nonreactive with the passivating layer. A desired pattern is formed in the metallic film to provide the desired diffusion masking. The desired modified conductivity-type regions are formed in the semiconductive body by utilizing the patterned metallic film as a diffusion mask. Subsequent steps are taken to contact the conductivity-modified regions of the semiconductor body to form the desired semiconductor device, as for example, diodes and transistors.

The novel features believed characteristic of the present invention are set forth in the appended claims. The invention itself, together with further objects and advantages thereof, may best be understood with reference to the following description, taken in connection with the accompanying drawing in which:

FIG. 1 is a flow diagram illustrating the process utilized in forming semiconductor devices in accord with the present invention, and FIGS. 2*a*–2*g* illustrate a semiconductor body during the various steps of the performance of the process illustrated by the flow diagram of FIG. 1 at the corresponding stages thereof.

Fundamentally, we have discovered that certain nonreactive metals, exemplified by molybdenum and tungsten, may be used to protect a passivating layer upon a semiconductor during fabrication and also serve as a diffusion mask for the formation of conductivity-modified, surface-adjacent regions without adversely affecting the characteristics of the passivating insulator, even at high diffusion temperatures. We find that molybdenum is unusually well suited for use in this respect.

In its broadest form, the present invention may be practiced with any of a number of refractory, nonreactive metals such as molybdenum, tungsten, copper, nickel, cobalt, iron, manganese, vanadium, tantalum, niobium, iridium, osmium, platinum, rhodium, alloys therebetween, alloys thereof with minor portions of reactive metals in which alloys the characteristics of the nonreactive metal predominate, and laminates of nonreactive metals surrounding reactive or other nonreactive metals, as well as with any suitable semiconductor material, as for example, germanium, silicon, gallium arsenide, or any semiconducting compound, such as silicon carbide, for example, wherein diffusion is utilized in fabrication of semiconductor devices therefrom.

The method of the present invention may be utilized to fabricate improved semiconductor devices of a wide variety of types, as for example, semiconductor diodes and transistors, to mention only a few, and to form asymmetric junctions such as $NN^+$-; $PP^+$-, PIN-, and PN-junctions, for example. For ease of description, the basic fundamentals of the invention will be described with respect to the formation of diffused PN-junction semiconductor devices preferably utilizing molybdenum or tungsten refractory metals, and a silicon semiconductor.

In the practice of the invention, many conventional process steps are utilized, but in a matrix of steps having unique results and resulting in devices having unique characteristics. Utilizing silicon as a semiconductor and molybdenum as a refractory, nonreactive metallic diffusion mask, the invention may be practiced, for example, substantially as follows:

A polished monocrystalline wafer of silicon having, for example, a diameter of approximately 1 inch and a thickness of approximately 0.010 inch and a predetermined conductivity type, as for example, N-type with a doping level of $10^{15}$ atoms of phosphorus per cubic centimeter, is provided in an illustrative practice of the invention. The wafer is heated in an atmosphere of dry oxygen for approximately ½ to 4 hours at a temperature of approximately 1,000° C., for example, in order to form a thermally grown film of silicon dioxide which serves to protect the silicon from atmospheric contamination and subsequently serves as a passivation layer for junctions formed within the silicon wafer, as is well known in the art. Alternatively, a thin film of silicon nitride ($Si_3N_4$), an amorphous mixture of silicon, oxygen, and nitrogen (silicon oxynitride) or aluminum oxide ($Al_2O_3$) may be deposited, as for example by pyrolysis at elevated temperature from appropriate gases, alone or over an oxide film. Times and temperatures of formation may be varied as is well known in the art to secure the desired thickness.

A thin metallic film, for example 5,000 AU thick, which is refractory and adheres well to the insulating-passivating films, as for example, in a preferred embodiment, molybdenum, is formed thereupon by vacuum evaporation or sputtering in an argon atmosphere, for example, and heated, as for example to 400° C. during deposition, to improve its adhesion to the insulating film. The thickness of the film may vary, as for example, from 1,000 AU to 10,000 AU in thickness, depending upon the degree of diffusion masking desired. Similarly, the time for formation thereof may vary as the thickness as well with the sputtering current, temperature, etc., as is well known in the art.

The metallic film coating the wafer is then patterned using a photoresist compound, many of which are available and well known to the art, a specific one of which is sold under the trade name KMER by Eastman Kodak Company of Rochester, N.Y., and described in the Eastman Kodak Company publication "Photosensitive Resists for Industry," published in 1962. Patterning, utilizing the photoresist, is done by spreading a layer of photoresist material over the entire metal coating on the surface of the passivated silicon wafer and exposing the photoresist material to light through a suitable mask, so that the portions of the wafer at which it is desired to form surface-adjacent, conductivity-modified regions are shielded from the light, generally ultraviolet, while the remainder of the surface is exposed to the light which reacts with photoresist material to initiate polymerization of the photoresist.

After exposure of the photoresist to the light, the mask is removed and the wafer is immersed in a developer such as is furnished by Eastman Kodak Company, for example, known as Photoresist Developer. This developer causes the unexposed portions of the photoresist to be dissolved away leaving a mask composed of a protective layer of photoresist over all but those portions of the silicon wafer which constitute the regions of the surface under which conductivity-modified regions are to be formed. Following developing of the photoresist, the wafer is heated at approximately 150° C. for approximately 1 hour in a nitrogen atmosphere, for example, to harden the film.

The wafer is next subjected to a ferricyanide etch bath, for example, to remove the molybdenum film at the unmasked portions thereof. Since the ferricyanide etch etches away molybdenum at a rate of approximately 9,000 AU per minute, a 5,000-AU-thick molybdenum film upon the wafer would require that the wafer be immersed in the ferricyanide for five-ninths of a minute, or slightly over one-half a minute. The photoresist is next removed by immersion in a commercially available photoresist stripper, such as for example J–100, available from Indust-Ri-Chem Laboratory of Richardson, Tex.

The wafer is then subjected to a diffusion step which may conveniently be accomplished by heating the wafer to approximately 1,100° C. in an ambient containing a suitable activator impurity to cause creation of surface-adjacent, conductivity-modified regions in all regions of the silicon wafer from which the molybdenum film has been removed, as described hereinbefore. Since it is conventional that many circuit elements are simultaneously formed on a single semiconductor wafer, a single (or several) integrated circuits may be formed upon a single wafer, or alternatively, many similar circuit elements or circuits may be formed by this process and later separated as, by cleaving or sawing, for example.

In the event that a P-type wafer of silicon is utilized, and it is desired that N-type, surface-adjacent regions be created by diffusion, the wafer is heated to a suitable temperature in a phosphorus atmosphere, such as vapors of elemental phosphorus in an atmosphere which is nonoxidizing with respect to molybdenum, to cause phosphorus atoms to diffuse through the oxide film exposed at the apertures in the metallic film and into the silicon wafer to cause the creation of surface-adjacent N-type regions. Due to lateral diffusion, the PN-junctions formed thereby intersect the surface of the silicon body beneath both the passivating film and the remaining portions of the molybdenum film.

In the event that an N-type silicon body is utilized, and it is desired to form surface-adjacent, P-type regions therein, the wafer is heated in an atmosphere of a suitable acceptor-containing gas, as for example diborane, to cause diffusion of boron atoms through the silicon dioxide film exposed by the mask created by the etching of the metallic film resulting in the formation of surface-adjacent, P-type conductivity-type regions in the silicon body.

Alternatively, if it is not desired to utilize the gaseous diffusion technique, a "doped" glass containing a minor quantity of donor or acceptor impurity, as for example, $SiO_2$ doped with the order of 1 percent boron may be deposited over the passivated and metal-masked silicon wafer and into the apertures in the metallic mask. Formation of such doped oxide films is described in detail in the aforementioned copending applications, Ser. Nos. 675,225 and 675,957, for example. The glass-coated wafer may then be heated for a suitable time, as for example 15 hours, and a suitable temperature, as for example 1,100° C., to cause the activator atoms to diffuse through an approximately 1,000-AU thick passivating $SiO_2$ film, causing the creation of conductivity-modified regions of the wafer. Conveniently, the film may be from 1,000 to 10,000 AU thick, for example. Temperature and time of diffusion also vary with the thickness of the thermally grown passivating layer being diffused through, as well as the thickness of the doped film, the depth of penetration desired and the crystal orientation. Diffusion temperatures generally range from 1,000° C. to 1,300° C. and times from 1 to 25 hours, depending upon the other parameters. Such determinations are "state of the art" and well known to the skilled worker.

As an example of this step, if it is desired to create N-type, surface-adjacent regions in a P-type silicon wafer, a thin coating of approximately 2,000-AU-thick glass doped with approximately 1.0 percent by weight of phosphorus atoms may, for example, be deposited. The wafer is then heated for approximately 15 hours at a temperature of approximately 1,100° C. to cause a concentration of the order of $10^{19}$ to $10^{20}$ atoms per cc. of phosphorus within surface-adjacent regions approximately 3 microns deep, corresponding to, and extending slightly farther laterally, approximately 3 microns, than the apertures within the metallic diffusion mask. Similarly, a boron-doped glass may be utilized to cause the creation of surface-adjacent, P-type conductivity regions in an N-type silicon wafer. Boron may be diffused into a lightly doped P-type wafer to from a $PP^+$-junction, while phosphorus may be diffused into a lightly doped N-type wafer to form an $NN^+$-junction.

After diffusion of the activator impurity through the passivation film, the wafer is further processed to form one or more semiconductor devices or circuits. It is only necessary to form suitable holes, smaller in dimension than the apertures in the metallic film through the insulation at the apertures, to an extent that the etching and subsequent contacting of the conductivity-modified regions do not, in any way deleteriously affect the junctions formed by diffusion, by the photoresist and development technique, for example, and contact the diffused surface-adjacent, conductivity-modified regions of the semiconductor device. Contact to the unmodified silicon body may, for example, be made by alloying to a conducting header, for example.

Generally, contact may be made to these regions by a number of techniques, however, as an example of one such technique, a layer of aluminum may be vacuum-evaporated or sputtered over the entire surface of the wafer and a photoresist deposited thereupon. The photoresist is then exposed to light through a suitable mask so that only those regions immediately adjacent the hole through which contact is made to the conductivity-modified region of the wafer are fixed and, upon development, all the remainder of the photoresist is taken away. The wafer is then bathed in a suitable etchant to remove the aluminum from all those areas which are not protected by the photoresist. The photoresist may then be removed by a suitable washing as is well known in the art. By the aforementioned generalized process, a semiconductor diode may be fabricated, contact to the diffused surface-adjacent, conductivity-modified regions being made through the contact formed by the method just described. Contact to the remainder of the body may be made to an opposite major surface of the semiconductor wafer using suitable techniques, as is described above, for example, and are as well known to the art.

In an alternative embodiment of the invention, the first-formed insulating layer upon the silicon wafer may be patterned in the same configuration as the molybdenum film formed thereover. This may conveniently be accomplished by etching the insulating film, subsequent to patterning of the molybdenum film, and diffusion of activators from a sufficiently thick doped $SiO_2$ film as to render it unnecessary to redeposit an oxide film after diffusion. Such etching of insulating layers is disclosed and claimed in the copending application of Tiemann et al., Ser. No. 606,242, filed Dec. 30, 1966, and assigned to the present assignee, the entire disclosure of which is incorporated herein by reference thereto. Briefly, this involves the etching and removal of the exposed portions of the passivating layer with an etchant which selectively removes the passivating layer but is substantially nonreactive with the metallic pattern. For example, "Buffered HF," containing approximately 1 volumetric part HF to 10 parts ammonium fluoride, is suitable to selectively etch silicon dioxide and not affect molybdenum or silicon. Diffusion of the activator impurity into the semiconductor wafer then proceeds as before, and subsequent fabrication steps proceed, as before. In making devices in accord with the invention plural passivating layers may be used. In this respect, any combination of those oxides and nitrides as is set forth hereinbefore, in any order, may be used, one particularly useful combination is that of silicon nitride over silicon dioxide as is described and claimed in the copending application of F. H. Horn, Ser. No. 530,811, filed Mar. 1, 1966, and assigned to the present assignee.

Figure 2:
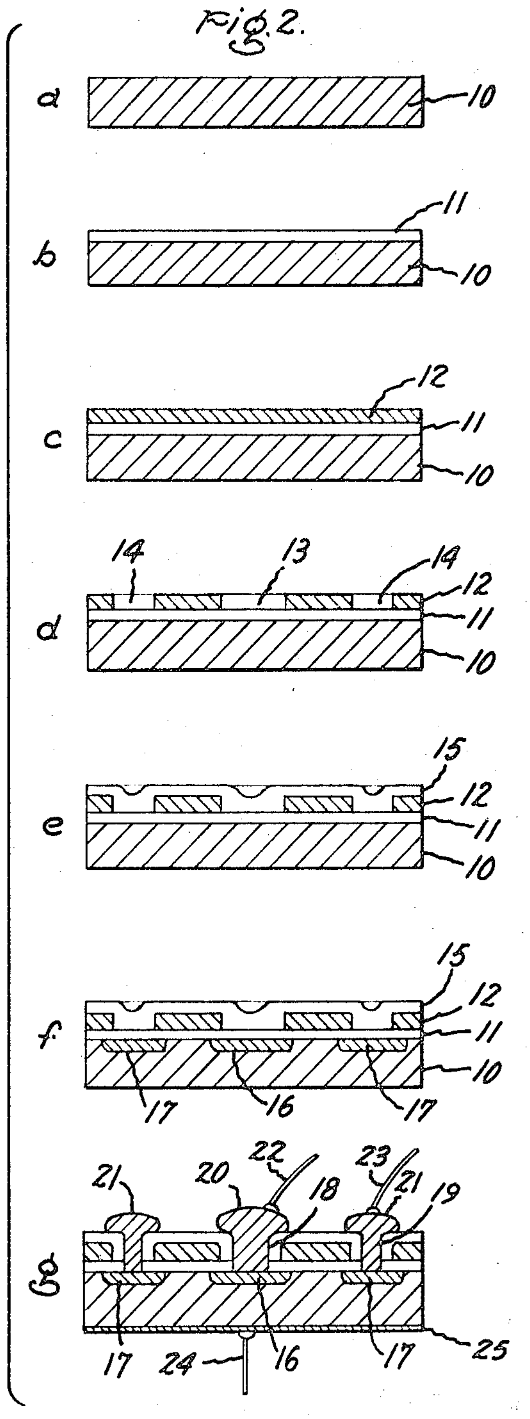

In further accord with the present invention, a semiconductor signal-translating device, as for example, a transistor, may be formed in accord with the invention. The formation of a transistor is illustrated in FIGS. 1 and 2 of the drawings, by flow chart in FIG. 1 and, by vertical cross-sectional views of a silicon semiconductor wafer corresponding to the state of the wafer at each corresponding stage of the flow diagram, in FIG. 2.

Fabricating a plurality of similar NPN-transistors upon a single wafer in accord with an example of one embodiment of the present invention is conducted substantially as follows. Following the flow chart of FIG. 1, a P-type silicon wafer having a concentration of boron atoms therein of approximately $10^{15}$ atoms per cc., for example, and a very large major surface dimension, as compared to its thickness dimension, such as approximately 1 inch in diameter and 0.010 inch thick is utilized, for example. Such a silicon wafer is illustrated in FIG. 2*a* and indicated as 10. In the next step of the formation of the transistors, a passivating film 11, approximately 1,200 AU thick, for example, is grown on wafer 10 by heating at a temperature of 1,000° C. in approximately 1 atmosphere of dry oxygen for 2 hours, as previously discussed, or may be deposited by other well-known techniques. Similarly, a film of silicon nitride, aluminum oxide, or silicon oxynitride, as disclosed and claimed in the copending application of F. K. Heumann, Ser. No. 598,305, filed Dec. 1, 1966, now abandoned, and assigned to the assignee of the present invention, the disclosure of which is incorporated herein by reference thereto, may be formed in lieu of a silicon dioxide or nitride layer. Alternatively, any combination of these films in any order may be utilized.

In the next step of the formation of transistors in accord with the present invention, a metallic film of a nonreactive nature with respect to passivating films, and having a good characteristic of masking diffusion of donor and acceptor activators for silicon, is deposited as film 12 over film 11 on silicon wafer 10. This is illustrated in FIG. 2*c*. Such a film may be 5,000 AU thick, for example. The thickness may vary, depending upon the thickness of the diffusion mask. Thus, for example, a 5,000 AU film of molybdenum serves an excellent diffusion mask for phosphorus at a diffusion temperature of 1,100° C. for 15 hours. Under these conditions less than $10^{15}$ phosphorus atoms per cc. diffuse through the molybdenum mask into the silicon, which therefore remains P-type in those portions covered by the molybdenum film.

In the next step, the molybdenum film 12 is masked with a photoresist, as described hereinbefore, and etched in a ferricyanide solution, for example, made up of 92 grams of potassium ferricyanide, 20 grams of potassium hydroxide, and 300 grams of water, for an appropriate length of time to remove all of the metallic material which is not covered by the developed photoresist. The details of one example of this step are described hereinbefore.

In the fabrication of transistors of the lateral bipolar type, for example, a single unit may conveniently occupy an area on the wafer having a diameter of approximately 0.014 inch. It is convenient, likewise, that the central N-type diffused region which generally constitutes the collector would be a circular region of approximately 0.005 inch in diameter, that the annular base region surrounding the collector be of the original P-type conductivity and have a radial thickness of approximately 2 microns and be surrounded by an annular diffused N-type region having a radial thickness of approximately 0.003 inch. Thus, it is desirable that the metallic layer be etched as described hereinbefore, to provide a central aperture of slightly less than 0.005 inch and an annular aperture concentric therewith having an inside diameter of approximately 0.0054 inch and an outer diameter of 0.011 inch. Thus, in accord with the present invention for each transistor, a central circular etched hole in the metallic layer 12 is made and an annular aperture 14 having the aforementioned dimensions is made concentric with central hole 13.

In accord with the next step of this example of this embodiment of the present invention, the entire wafer may conveniently be covered with a film 15 of phosphorus-doped glass containing approximately 1 weight percent of phosphorus and having a thickness of approximately 2,000 AU, for example. The coated wafer 10 is placed in a furnace and heated in an inert atmosphere for approximately 15 hours at a temperature approximately 1,100° C. to cause the phosphorus to pass through the oxide at the unmasked portions of the wafer and diffuse to a depth of approximately 3 microns into the P-type wafer to cause a plurality of surface-adjacent, diffused regions 16 and 17 approximately $10^{20}$ atoms per cc. of phosphorus, which slightly undercut the diffusion mask, about 3 microns, comprising the remaining portions of metallic film 12. Regions 16 and 17 constitute the collector and emitter, respectively, of a lateral bipolar transistor.

Thereafter, a hole 18 and an annular groove 19, both of which are smaller than the apertures in the metallic film (so as not to adversely affect junction passivation) insuring that the hole is as remote as possible from the junction where it intersects the surface of the wafer, are etched through the insulating films 11 and 15 overlying the collector region 16 and the emitter region 17, respectively, in order to make connection thereto, as for example with "Buffered HF" etchant. The entire wafer is then coated, as for example, with a sputtered or vacuum-evaporated layer of aluminum in order to make contact to emitter and collector regions and, thereafter, the surface thereof is masked with a developed photoresist to leave only selected regions constituting emitter and collector electrodes. The remaining metal is removed by etching the aluminum in a suitable etchant to remove the remainder, leaving emitter electrode 21 and collector electrode 20. Electrical contact 22 is made to collector electrode 20 and electrical contact 23 is made to emitter electrode 21 as, for example, by thermobonding. The device is completed with electrical contact 24 to an aluminum-coated layer 25 to form the base contact, and the transistor is completed and illustrated in FIG. 2*f* of the drawing.

In accord with another embodiment of the invention, the basic concept of using a nonreactive refractory metal, such as molybdenum, as a diffusion mask may be practiced in an alternative approach in which the passivating-insulating film, which is first formed upon the semiconductor body, is also patterned with apertures coincident with the apertures in the molybdenum film. This modification requires that, at the fourth step of the flow chart of FIG. 1, the step includes a first etching (for example, in a ferricyanide bath to etch molybdenum) to remove selected portions of the metal film, and a second etching (in a Buffered HF solution—10 parts $NH_4F$ plus 1 part HF—to etch silicon dioxide) to remove the passivation layer exposed by etching of the metallic film. In this embodiment, at this juncture, the metallic film serves as an etch mask for the insulating film, as contrasted to its special role in accord with the invention, of serving as a diffusion mask, as for example, against boron and phosphorus. The differences in the process steps thereafter are that, since it is not necessary to diffuse dopants through the passivation film to form a diffused surface-adjacent, conductivity-modified region in the exposed silicon wafer, diffusion steps need not be carried out for as long a time as when the passivation film was not partially removed, and that the doped $SiO_2$ film be of sufficient thickness to isolate electrically all the previously exposed portions of the processed wafer. Such a thickness may, for example, be about 5,000 AU.

The same modification is possible in any embodiment of the invention described herein, irrespective of the type semiconductor device being formed.

A transistor constructed in accord with the foregoing described procedure may be utilized to transform a relatively low-power electronic signal in a low-impedance circuit into relatively high-power signal in a high-impedance circuit by connecting the input thereto between emitter lead 23 and base lead 24 and connecting the output therefrom between collector lead 22 and base lead 24.

By the foregoing disclosure, we have described improved methods for forming semiconductor devices such as diode rectifiers and transistors by utilizing a metallic film which is not reactive with a passivation film and which exhibits superior diffusion masking characteristics with respect to activator impurities, and which exhibits excellent protection for passivating films.

Molybdenum and tungsten are ideally suited for the practice of the invention by virtue of their high-temperature characteristics and complete nonreactive nature with respect to insulating dielectrics such as $SiO_2$, for example. For convenience's sake the invention has been described principally with respect to the use of molybdenum metal and silicon semiconductor, respectively. Notwithstanding this, other metals which are nonreactive with insulating dielectrics may be also used to advantage in practicing the invention. Thus, for example, other high-temperature "refractory" metals, also nonreactive with insulating dielectrics may be used. Such metals as tantalum, niobium, iridium, platinum, and rhodium are similarly refractory and not reactive with dielectric insulating films, such as oxides, are quite well suited, and may be used to impede the diffusion of activator materials.

Similarly, other nonreactive materials which do not react with insulating oxides and other insulators utilized therewith, but which are not truly "refractory" in the strictest sense, may also be used. Some such materials are copper, nickel, cobalt, iron, manganese, and vanadium. Although these materials are not "refractory" in the strictest sense, they nevertheless have high melting points and will be denominated herein as "refractory" metals.

The metallic film used as a diffusion mask in accord with the present invention may also comprise any alloy, in any proportions, between any of the foregoing metals. Additionally, alloys of these metals which are comprised, in a major part, of these metals, such that the chemical properties of the alloy are those of the nonreactive "refractory" metal, and particularly, that the alloy be nonreactive with the oxide or other insulator used.

Advantages of the alloys are that many such alloys exhibit improved adhesion characteristics with respect to the insulators, principally silicon oxide, utilized in semiconductor fabrication. Such adhesion characteristics are often better than the characteristics of the nonreactive refractory metals and are greatly desirable in semiconductor device and circuit fabrication. Another highly desirable characteristic of alloys of normally reactive metals with refractory nonreactive metals in proportions such as to exhibit no reaction with semiconductor device insulators is improved resistance to oxidation. Additionally, another advantage to the use of the alloys of reactive metals with refractory, nonreactive metals is an improved diffusion masking characteristic, greatly enhancing the basic concept of the metallic diffusion mask. The concept of the metallic diffusion mask of the invention is, however, a property of true metals and metallic alloys and does not include metalloids, as for example, germanium and silicon.

Some such reactive metals which may be added (in minor portion) to form alloys with the above-listed, nonreactive, refractory metals to form metallic films having one or more of the advantages of improved adhesion, improved resistance to oxidation and improved diffusion masking characteristics are titanium, zirconium, aluminum, and beryllium.

An additional, and in some instances, more advantageous, method of securing the benefit of excellent masking (against diffusion) metals which may have unacceptable reactivities with insulators, such as oxides, is to incorporate a layer of such a reactive metal (or even of a nonreactive metal) having a substantial thickness between thin layers or films of a nonreactive, refractory metal. In such an arrangement a large mass of good masking metal is present, but the contact to the oxide (or other insulator) is between the bounding refractory, nonreactive metal. Additionally, the materials constituting the laminate may be chosen of materials having physical constants such that the thermal expansion thereof results in zero net strain over a wide temperature range with respect to the other components of the body.

In still another alternative structure, the outer, last-deposited metal layer (which does not necessarily have to contact the oxide or other insulator) may be chosen primarily for ease of bonding for contact-making purposes.

From the foregoing it may be appreciated that the basic concept of the nonreactive metallic diffusion mask of the present invention may take numerous forms. While various adaptations of the structure utilizing different materials may be used, we nevertheless prefer, for all-around use and generalized criteria, to use molybdenum or tungsten.

While only certain embodiments and examples of the present invention have been described herein, it is apparent that many modifications and changes will occur to those skilled in the art. Accordingly, we intend, by the appended claims, to cover all such modifications and changes as fall within the true spirit and scope of the present invention and specification.

What we claim as new and desire to secure by Letters Patent of the United States is:

1. In the fabrication of a semiconductor device including a semiconductor body of a first electrical conductivity type having a major surface, at least one major surface-adjacent diffused region of a second electrical conductivity type defining at the interface therebetween a junction which intersects said major surface in a geometric pattern, and a passivating-insulating film overlying said major surface and covering portions thereof at which said junction intersects, the improvement which comprises:

a. depositing upon said insulating film a metallic film of a metal selected from the group consisting of molybdenum, tungsten, tantalum, niobium, iridium, platinum, rhodium, copper, cobalt, iron, manganese and vanadium, which is chemically and mechanically stable at diffusion temperatures of approximately 1,000°–1,300° C. and which is nonreactive with said insulating film and which is in contact therewith and adherent thereto;

b. forming a pattern in said metallic film which pattern includes an aperture corresponding to the portion of said body at which said major surface-adjacent diffused second-conductivity-type region is to be formed, and c. diffusing at a diffusion temperature of approximately 1,000°–1,300° C. an activator impurity selected from the group consisting of boron and phosphorus through said insulating film into said major surface-adjacent region of said semiconductor body substantially coextensive with said aperture while utilizing the remaining portions of said thin metallic film as a diffusion mask.

2. The improvement of claim 1 wherein said insulating film is selected from the group consisting of silicon dioxide, silicon nitride, silicon oxynitride, and aluminum oxide.

3. The improvement of claim 2 wherein said insulating film is silicon dioxide.

4. The improvement of claim 1 wherein said insulating film is selected from the group consisting of silicon dioxide, silicon nitride, silicon oxynitride, and aluminum oxide in any combination and sequence, and said semiconductor material is silicon.

5. The improvement of claim 4 wherein said insulating film is silicon dioxide.

6. The improvement of claim 1 wherein said metallic film is a refractory metallic substance.

7. The improvement of claim 1 wherein the activator impurity is diffused into said semiconductive body from a film of doped insulator which is deposited over the surface of said semiconductor body after the patterning of said metallic film.

8. The improvement of claim 1 wherein said metal is selected from the group consisting of molybdenum and tungsten.

9. The improvement of claim 6 wherein said metallic film comprises a metal selected from the group consisting of molybdenum and tungsten.

* * * * *